United States Patent
Tu

[11] Patent Number: 6,100,138
[45] Date of Patent: Aug. 8, 2000

[54] METHOD TO FABRICATE DRAM CAPACITOR USING DAMASCENE PROCESSES

[75] Inventor: Yeur-Luen Tu, Taichung, Taiwan

[73] Assignee: Worldwide Semiconductor Manufacturing Corp., Hsinchu, Taiwan

[21] Appl. No.: 09/375,519

[22] Filed: Aug. 17, 1999

[30] Foreign Application Priority Data

Jul. 7, 1999 [TW] Taiwan ................................ 88111553

[51] Int. Cl.[7] .............................................. H01L 21/8242
[52] U.S. Cl. ...................... 438/253; 438/254; 438/396; 438/397; 438/239; 257/306; 257/296
[58] Field of Search ................................... 438/253, 254, 438/239, 396, 397; 257/296, 306

[56] References Cited

U.S. PATENT DOCUMENTS

| | | | |
|---|---|---|---|
| 5,780,339 | 7/1998 | Liu et al. | |
| 5,837,577 | 11/1998 | Cherng | 438/253 |
| 5,879,986 | 3/1999 | Sung | 438/253 |
| 5,895,239 | 4/1999 | Jeng et al. | 438/239 |

*Primary Examiner*—Tom Thomas
*Assistant Examiner*—Nitin Parekh

[57] ABSTRACT

The DRAM capacitor fabrication in terms of damascene technology is disclosed. The processes are sequentially formed with word lines, landing pads and first interpoly dielectric (IPD1) layer. Thereafter, two approaching ways can be chosen. In the first embodiment, a thin nitride barrier is formed firstly, then the bit lines and IPD2 layer are formed. After that, a line mask pattern perpendicular to the bit lines are formed to serve as mask and use the nitride caps and nitride spacers as hard masks, then etching processes are implemented to form the storage nodes touching the landing pads. For increasing the storage node areas, the line masks are then descum in order to etch the IPD2 furthermore. The etch IPD2 process is using the nitride barrier as etching stopper. Then in-situ doped poly is deposited to form the bottom electrode. In the second embodiment, most of the processes are same as the first embodiment, except the thin nitride barrier process. The latter embodiment is to form a thin nitride liner after bit lines and nitride spacers are formed.

20 Claims, 19 Drawing Sheets

METHOD TO FABRICATE DRAM CAPACITOR USING DAMASCENE PROCESSES

FIELD OF THE INVENTION

The present invention relates to a semiconductor memory process, and more specifically, to DRAM capacitor fabricating processes by using damascene processes.

BACKGROUND OF THE INVENTION

The computer and electronics industry demand of increasing its whole speed performance as well as it's cost down for fabricating integrated circuits. As far as a computer technology is concerned, there is no doubt that the DRAM integrated circuit plays a crucial role because DRAMs used in the computer are very large, and thus DRAMs play a vital factor which determines the computer's performance. Hence, pursuing the miniaturization of the DRAM device so as to reduce the cost as well as high-speed performance are almost the ultimate goals.

Considering miniaturization of the device or the high-speed performance, the DRAM cell's storage capacity is a major factor which needs to be considered. The capacitor is formed with a storage node, a cell plate, and an intervening dielectric layer. Thus the storage capacity could be increased by making the capacitor dielectric thinner, by using an insulator with a larger dielectric constant, or by increasing the area of the capacitor. The first two options are not viable, since capacitor dielectrics thinner than those now being used in DRAM cells will suffer leakage due to Fowler-Nordheim tunneling. The suffering from a higher leakage for using a larger dielectric constant insulator is also reported in some research. Thus, for one-transistor DRAM, a large surface area of the storage node and cell plate are necessary in order to provide high capacitance and therefore optimal performance of the capacitor. However, a large surface area of the storage node and cell plate are conflicted with the shrinkage of the feature size of the DRAM.

Balanced against this need is the competing requirement that the capacitor also occupy a minimum of space on the semiconductor substrate on which the capacitor is formed. One manner in which the semiconductor industry has approached minimal space capacitor formation is to form the capacitor at a significant distance above the semiconductor substrate. When so doing, the storage node and the cell plate are typically wrapped around the other, forming what is known as a stacked capacitor.

However, by using a conventional method, the aspect ratio of the contact hole for forming such a stacked capacitor, tends to gradually increase in accordance with the use of three dimensional capacitor structures in the vertical direction. The decrease of the contact-hole diameter and its high aspect ratio impose a large burden on subsequent photolithography and etching steps. If the photolithography is carried out without accurate alignment, the contact hole cannot be formed at a desired site. Also, in the case of a high aspect ratio, it is likely that the etching process of the contact hole will cease before the interlayer insulation film is entirely removed.

Recently, a concept of 'landing pad' is prone to improve the DRAM capacitor manufacturing process so as to resolve the misalignment issue. The U.S. Pat. No. 5,780,339, entitled "Method for fabricating a semiconductor memory cell in a DRAM." is an example. See FIG. 1.

However, to fabricate a DRAM capacitor in prior art patent, two mask layers are still required for forming the storage node contact and storage node. In addition, the patent didn't fully utilize the two dielectric layers 22 and 28, and thus the issue of the topology height is still exist for making large capacitor area.

Consequently, an improved method is needed to overcome the above-discussed problems.

SUMMARY OF THE INVENTION

An object of the invention provides a method for fabricating a DRAM cell. The invention uses a non-critical mask with line pattern, nitride cap, and nitride spacer as a hard mask for forming storage nodes. And thus the invention reduces a storage node contact mask-count.

The other object of the invention is to reduce the topographic height for a DRAM cell. It is because the available space of IPD2 is fully utilized by using O2-base etching chemistries to descum the line pattern and using the nitride barrier as an etching stopping layer. Thus the etching process does not harm to the IPD1.

The method comprises following steps: at first, a semiconductor substrate is provided, upon which isolation regions, word lines with caps and word line spacers, source/drain regions are formed. After that, a self-aligned contact method is used to form an insulating region on each top layer of word lines so as to define the openings for forming landing pads. The landing pads are used for storage node contacts or bit line contacts. A first interpoly dielectric (IPD 1) is then formed on all regions. Then two approaching ways can be chosen. One is to form a thin nitride barrier layer and then to form the bit lines and bit line spacers sequentially. The other one is to form bit lines and spacers on the IPD1 firstly, and then to form a thin conformal nitride liner.

Subsequently, a second interpoly dielectric layer (IPD 2) is formed to fill the resulting topography. Thereafter, the non-critical line masks perpendicular to the bit lines are formed atop the landing pads so as to define the storage node contacts. Each line mask is properly aligned so that the line opening between two lines is in width smaller than the landing pad, and the line opening each is above and within only one landing pad.

The dry etching processes are then performed to expose portions of the landing pads by etching the IPD2, through the thin nitride barrier, and the IPD 1, using the line pattern as masks and, the nitride cap, nitride spacers as hard masks. After that, the line photoresist masks are shrunk by processing a descum process, an etching process is then done to expand the upper portion of the recessed regions.

Subsequently, a first in-situ doped (ISD) polysilicon is formed to serve as the capacitor storage node. A photoresist then refills the remnant portions of recessed regions. CMP process is then applied to planarize the surface by removing portions of the first ISD polysilicon and IPD2 layer using the nitride cap as a stopping layer. Finally, after the photoresist is stripped, a conformal thin dielectric layer and another ISD polysilicon is formed on the first ISD polysilicon successively.

BRIEF DESCRIPTION OF THE DRAWINGS

The foregoing aspects and many of the attendant advantages of this invention will become more readily appreciated as the same becomes better understood by referring to the following detailed description, when taken in conjunction with the accompanying drawings, wherein.

DETAILED DESCRIPTION OF THE PREFERRED EMBODIMENT

The storage nodes and storage node contacts are critical lithographic layers as depicted in the background of the invention. In addition, for increasing the area of a DRAM capacitor, it demands to increase the capacitor height. However, it will result in lithographic and etching technological difficulty while the metal contact processes forming are concerned. The present invention provides a method for resolving above issues.

Figure 1:
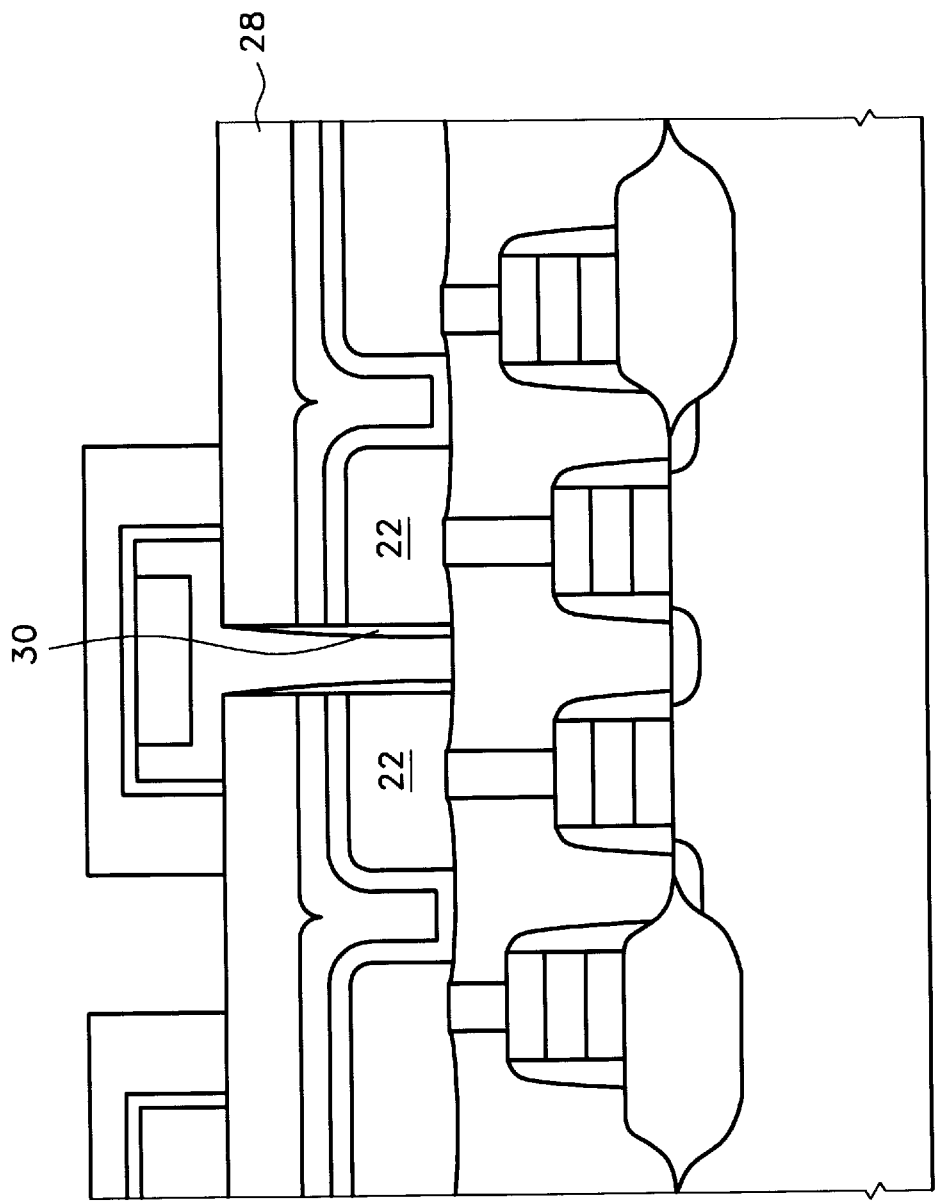
FIG. 1 is a cross-sectional view of a DRAM cell in accordance with the prior art.
Figure 2A:
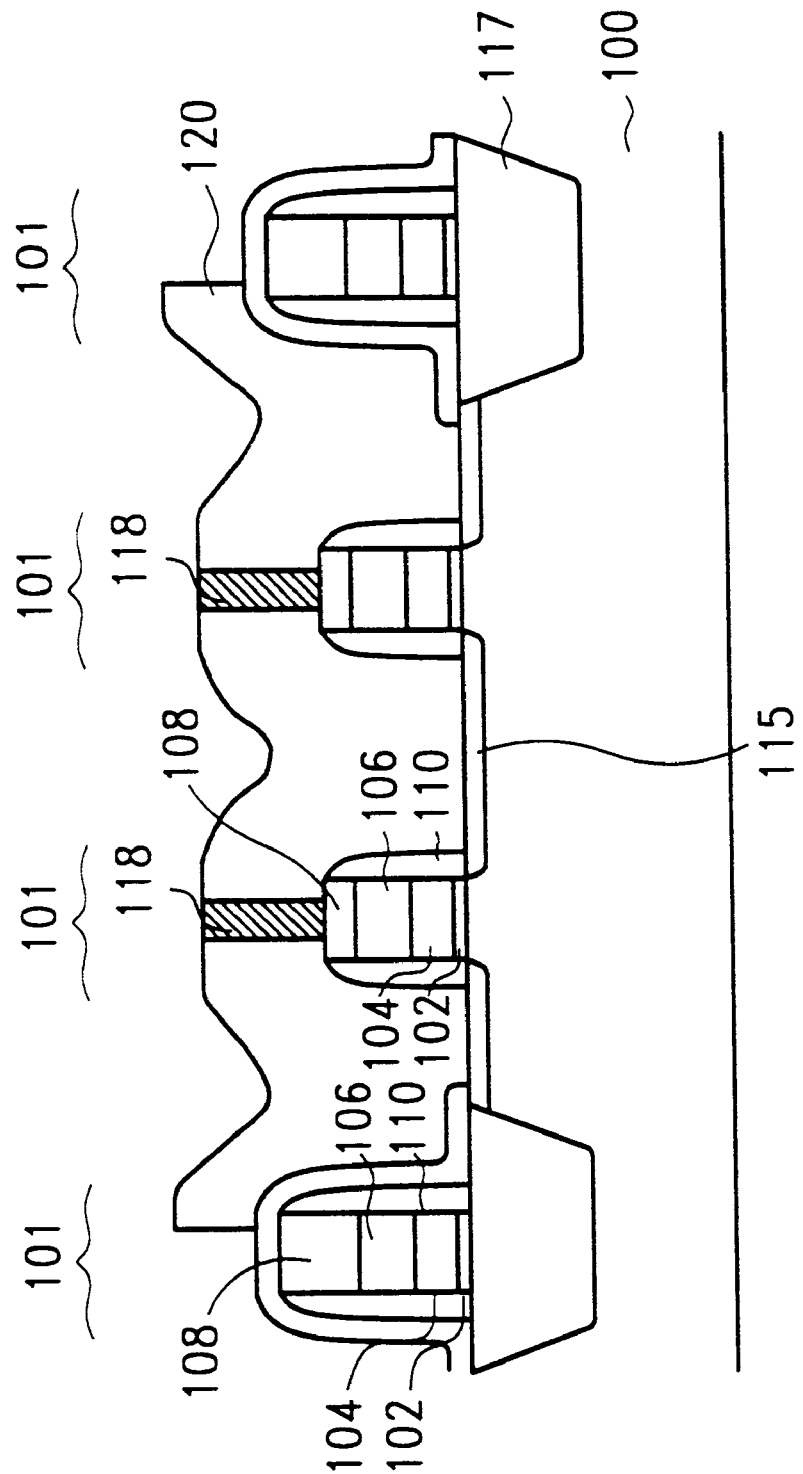
FIG. 2A is a cross-sectional view of forming landing pads on word lines, source/drain regions in accordance with the present invention.
Figure 2B:
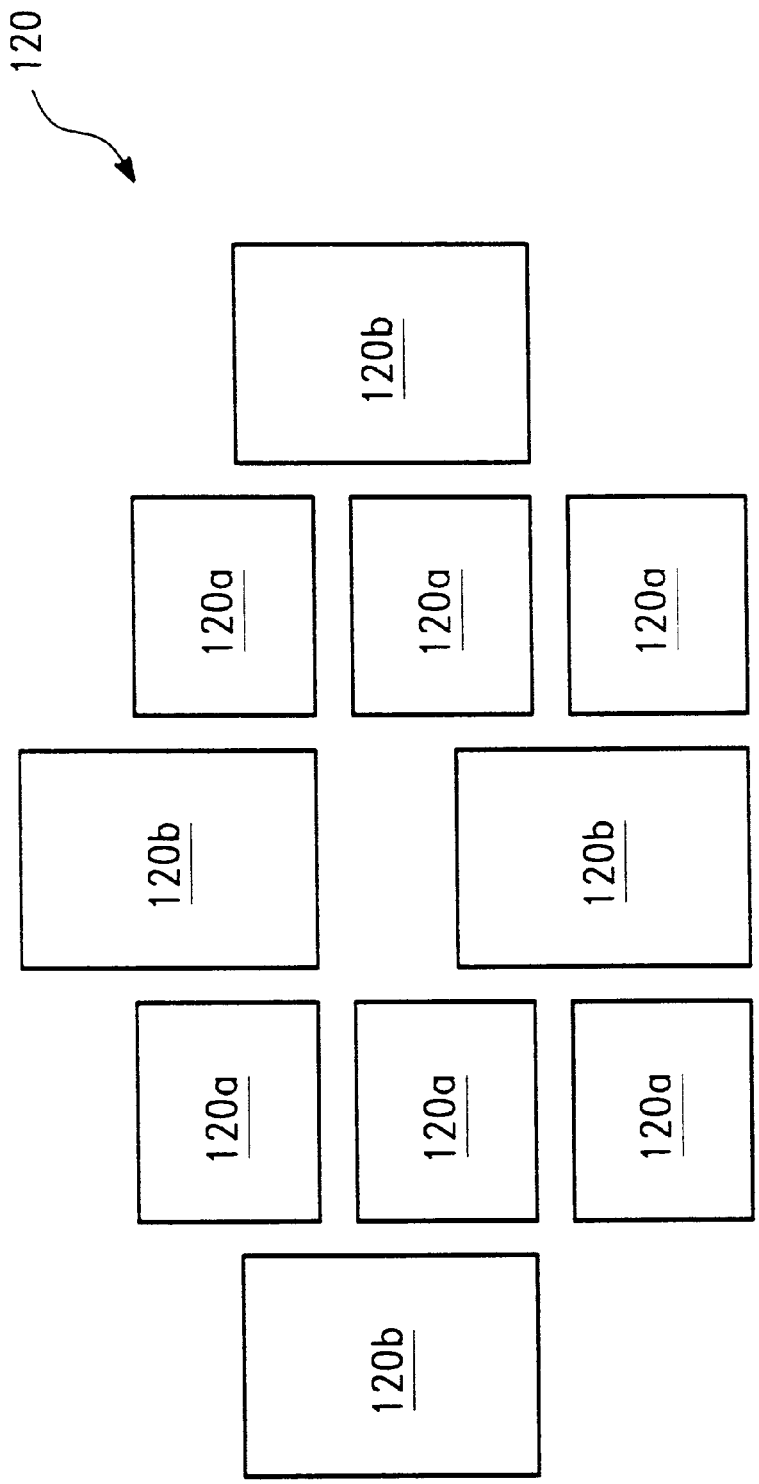
FIG. 2B is a synoptic layout of landing pad in accordance with the present invention.

Referring to FIG. 2A, a semiconductor substrate 100 is provided upon which a plurality of stack-gates 101, source/drain regions 115, landing pads 120 and isolation regions 117 are formed by a conventional method. The stack gates 101 serve as word-lines and provide control signals to the memory cell. Each stack gate 101 comprises a gate oxide layer 102, a polysilicon layer 104, a metal silicide 106 and a nitride capping layer 108 that are sequentially formed on the semiconductor substrate 100. The semiconductor substrate 100 is preferably a silicon wafer, however, any suitable type of semiconductor substrate may be used such as silicon on insulator (SOI), silicon on sapphire (SOS) and the like. Each stack gate 101 is provided at the sidewall thereof with a protective spacer 110. The spacer 110 is preferably composed of silicon dioxide or silicon nitride. In the depicted embodiment, the protective spacers 110 are silicon nitride spacers. The isolation region 117 can be either formed as a trench-isolation or a FOX-isolation in accordance with the process requirement. For connecting the bit lines and the source/drain regions, the landing pads or landing plugs 120 are formed. For example, for forming landing plugs, they can be manufactured by using a conventional self-aligned contact (SAC) method, beginning from forming a thick dielectric layer 118 composed of TEOS oxide on all regions. Then forming the contact holes by patterning the dielectric layer 118 to expose a portion of source/drain regions 115. After that, a wet etching is performed to expand the contact holes and only a slim dielectric layer on the nitride cap layer is remnant so as to define the openings for landing plug. The selective etching process has a selectivity ratio of about 20:1 for oxide to nitride. The synoptic layout of the landing pads is shown in FIG. 2B, includes landing pads 120 for bit line contacts 120b and storage nodes 120a. In a preferred embodiment, for 0.25 $\mu$m feature size of DRAM, the sizes of landing pad 120a for storage node is about 0.4–0.55 $\mu$m, respectively, along the word line and bit line. In addition, the line spacing between two adjoin landing pads is between about 0.1–0.2 $\mu$m. An alternative method of fabricating the landing pad 120 is to form a conducting layer on the stack gates 101, source/drain regions 115, and the isolation regions 117 firstly. After a mask pattern formed on the conductive layer, an etching step is followed to pattern the conducting layer as landing pads 120.

Subsequently, a conductive material filled in all regions, and then an etch back is implemented to form landing pads 120; the results are shown in FIGS. 2A–2B. The landing pad 120 is composed of a material such as tungsten, titanium, titanium silicide, or polysilicon. In the depicted embodiment, the layer of conductive material comprises polysilicon, and is deposited by a chemical vapor deposition.

Figure 3A:
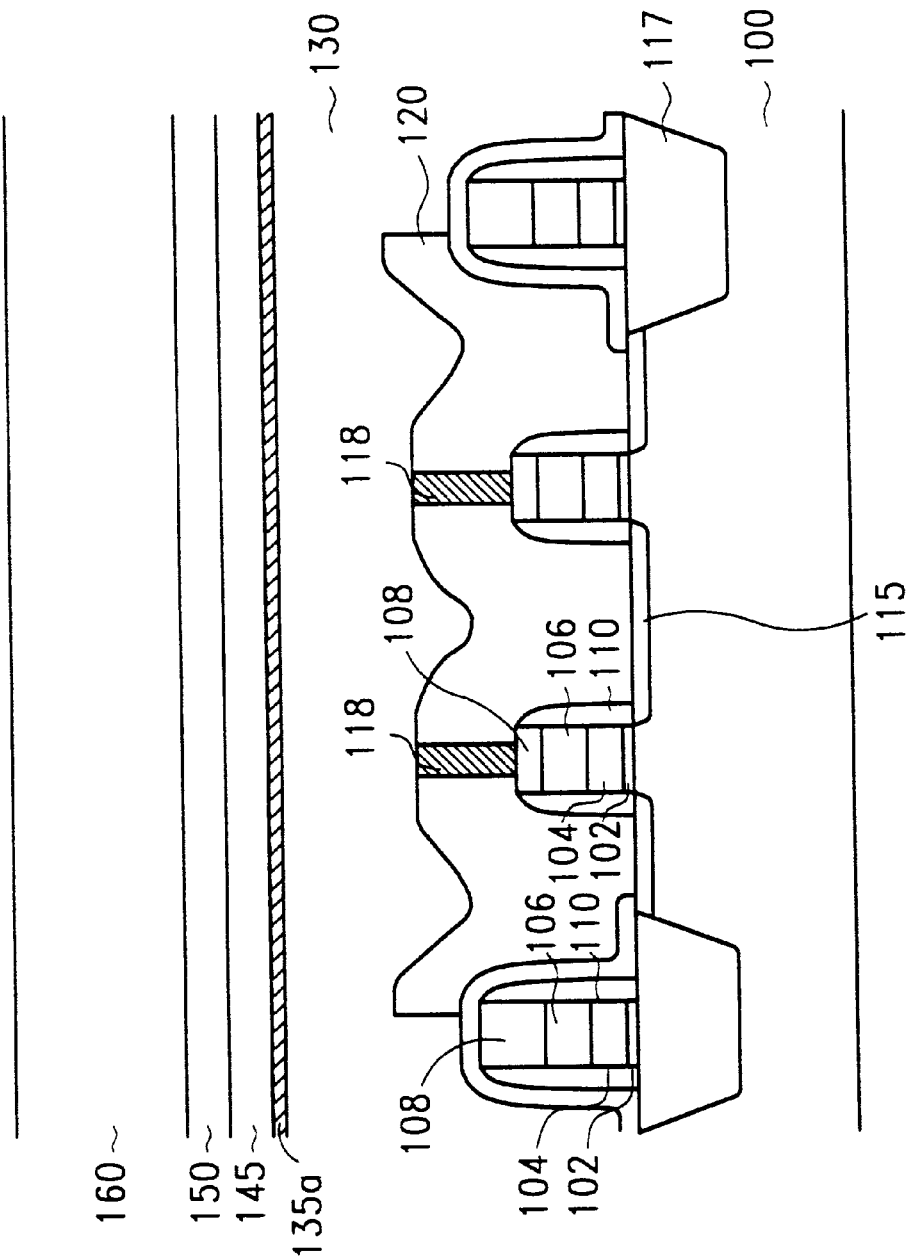
FIG. 3A is a cross-sectional view of forming a thin nitride barrier layer, a conductive layer, and a nitride capping layer on the IPD1 in accordance with the present invention.

FIG. 3A a refilled process using first inter-poly dielectric-layer (herein and after called IPD 1) 130 in the resulting structures is done. Preferably, the material is a LPTEOS (low pressure tetraethyl orthosillicate), PETEOS (plasma enhanced TEOS) a BPSG, a HDP CVD oxide, or an ozone TEOS layer. Typically, the IPD1 130 is about 200–400 nm in thickness. An optional etched back or a CMP process is performed to obtain a smooth topography for forming bit lines.

Then thereafter, for processing the damascene processes, there are two choices to select. In the first embodiment, a thin nitride barrier layer 135a, a polysilicon layer 145, a tungsten silicide layer 150, and a thick nitride layer 160 (e.g. silicon nitride) are sequentially formed on the IPD1 130. Preferably, the thin nitride barrier 135a is between about 15–50 nm in thickness being as an etching stopper while processing the damascene processes. The thick nitride layer 160 is a capping layer for protecting the conductive layer, and is between about 200–600 nm in thickness.

Figure 3B:
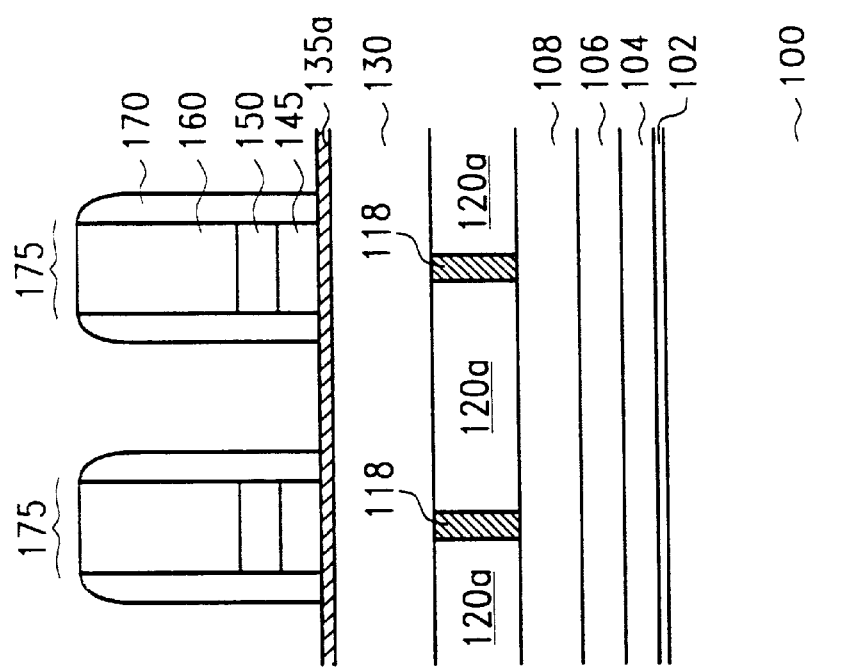
FIG. 3B is a cross-sectional view of forming bit lines and nitride spacers in accordance with the first embodiment of the present invention.

The resulting multi-layer structure is then patterned to form the bit lines 175. Sidewall nitride spacers 170 of about 0–100 nm in thickness for protecting the bit lines are then formed. FIG. 3B shows a cross-sectional view along a line a–a' in FIG. 4, a top view of the cells layout, where the bit line 175 with nitride spacer 170, word lines 101, and the landing pad 120 are shown.

Figure 3C:
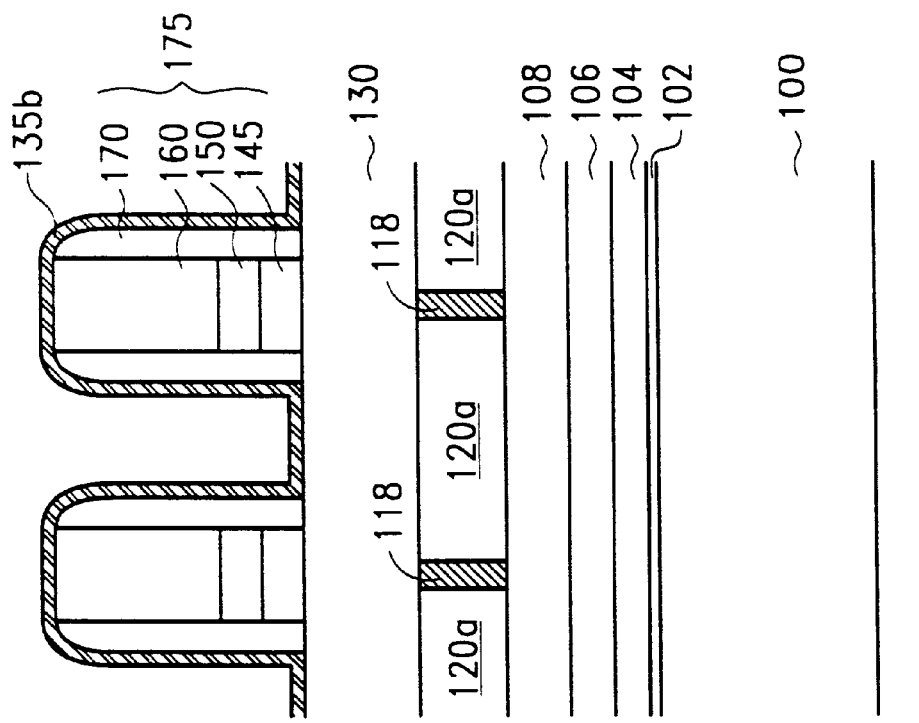
FIG. 3C is a cross-sectional view of forming bit lines, nitride spacers, and silicon nitride liner in accordance with the second embodiment of the present invention.
Figure 4:
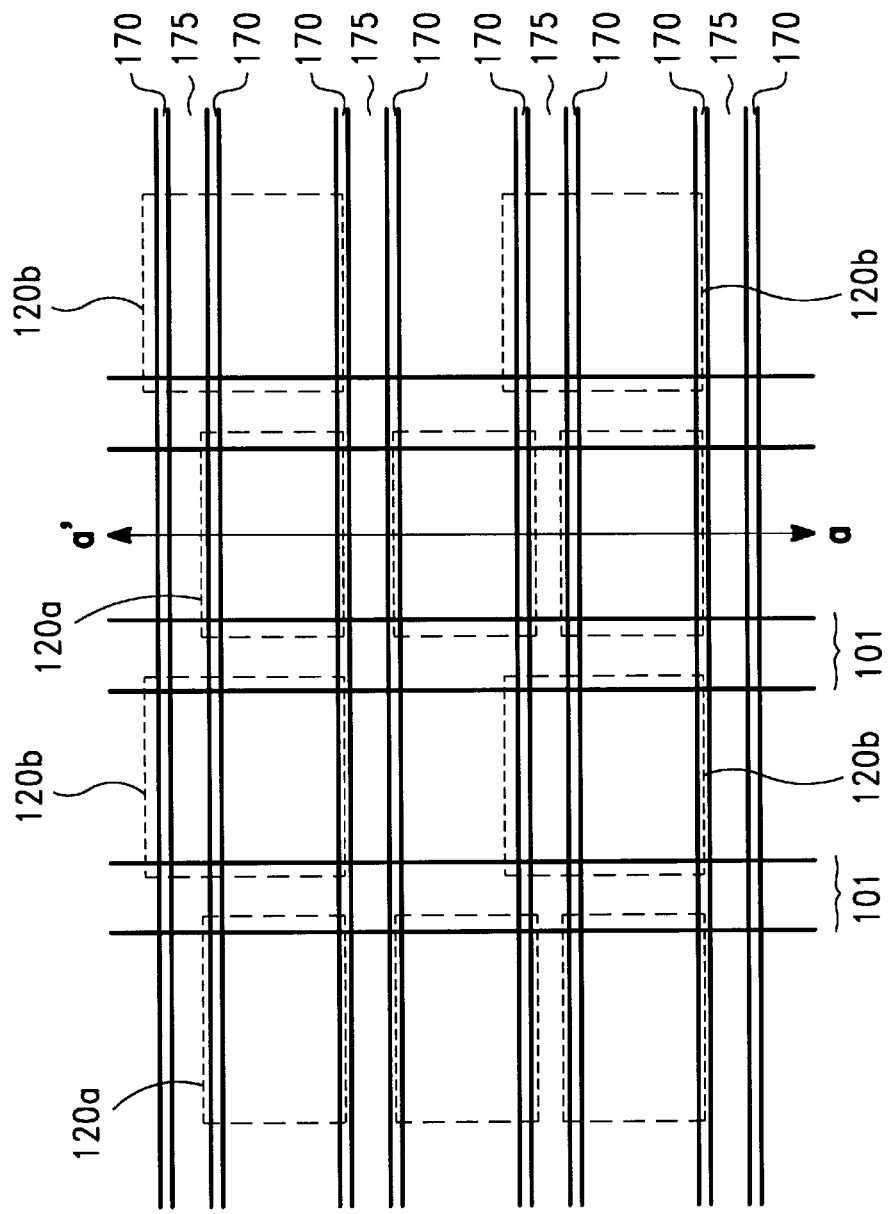
FIG. 4 is a synoptic layout, showing the landing pads, bit line, and word lines.

An alternative embodiment, the second embodiment, is shown in FIG. 3C, a cross-sectional view along a line a–a' in FIG. 4 as well. In the embodiment, the bit lines 175 are formed firstly by patterning the polysilicon layer 145, the tungsten silicide layer 150 and, a thick nitride layer 160. Thereafter, the nitride spacers on the sidewalls of the bit lines are formed. Then, forming the thin conformal silicon nitride liner 135b of between about 15–50 nm is followed on all areas (i.e. on the bit line and the elsewhere of the IPD1).

Figure 5A:
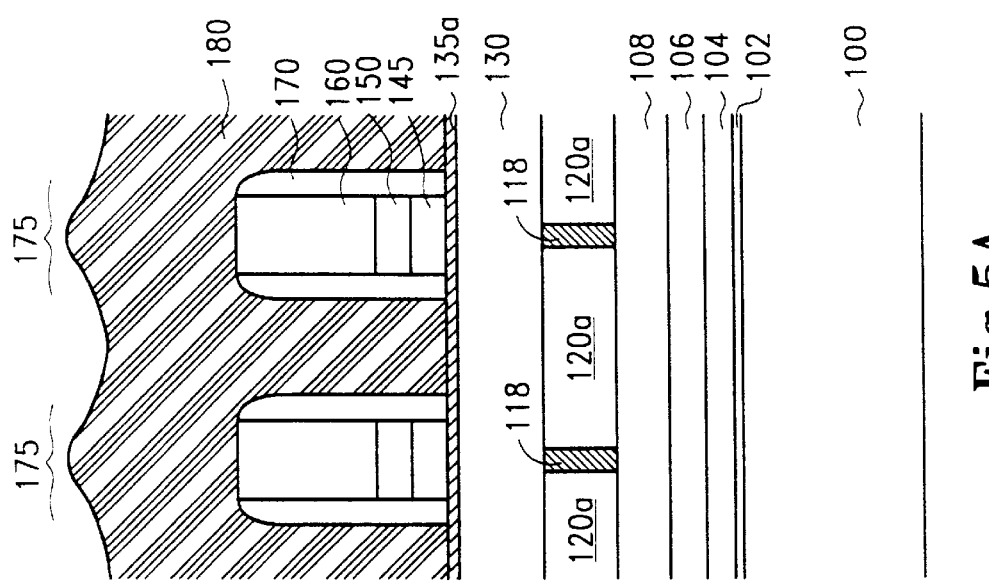
FIG. 5A is a cross-sectional view of forming the IPD2 to fill the spaces between bit lines in accordance with the first embodiment of the present invention.
Figure 5B:
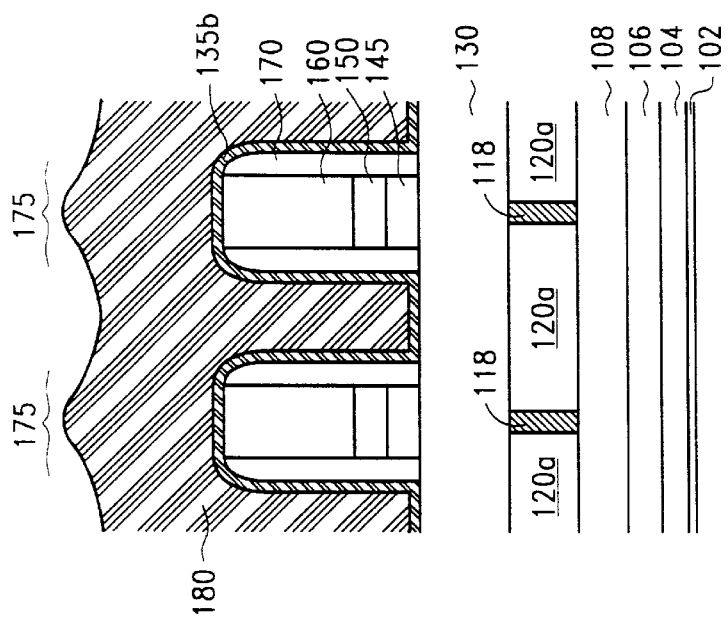
FIG. 5B is a cross-sectional view of forming the IPD2 to fill the spaces between bit lines in accordance with the second embodiment of the present invention.

Referring to FIGS. 5A and 5B, a gap refilled the spaces between the bit lines 175 with a second inter-poly dielectric layer (a IPD2 layer 180) is implemented. Similar to the IPD1 130 layer, the IPD2 is preferably formed of a BPSG (borophosphorus silica glass) layer, high density plasma CVD oxide layer or an ozone TEOS oxide layer, having a thickness of about 400–600 nm. FIG. 5A shows process results according to the first embodiment, and FIG. 5B is process results according to the second embodiment.

Figure 6:
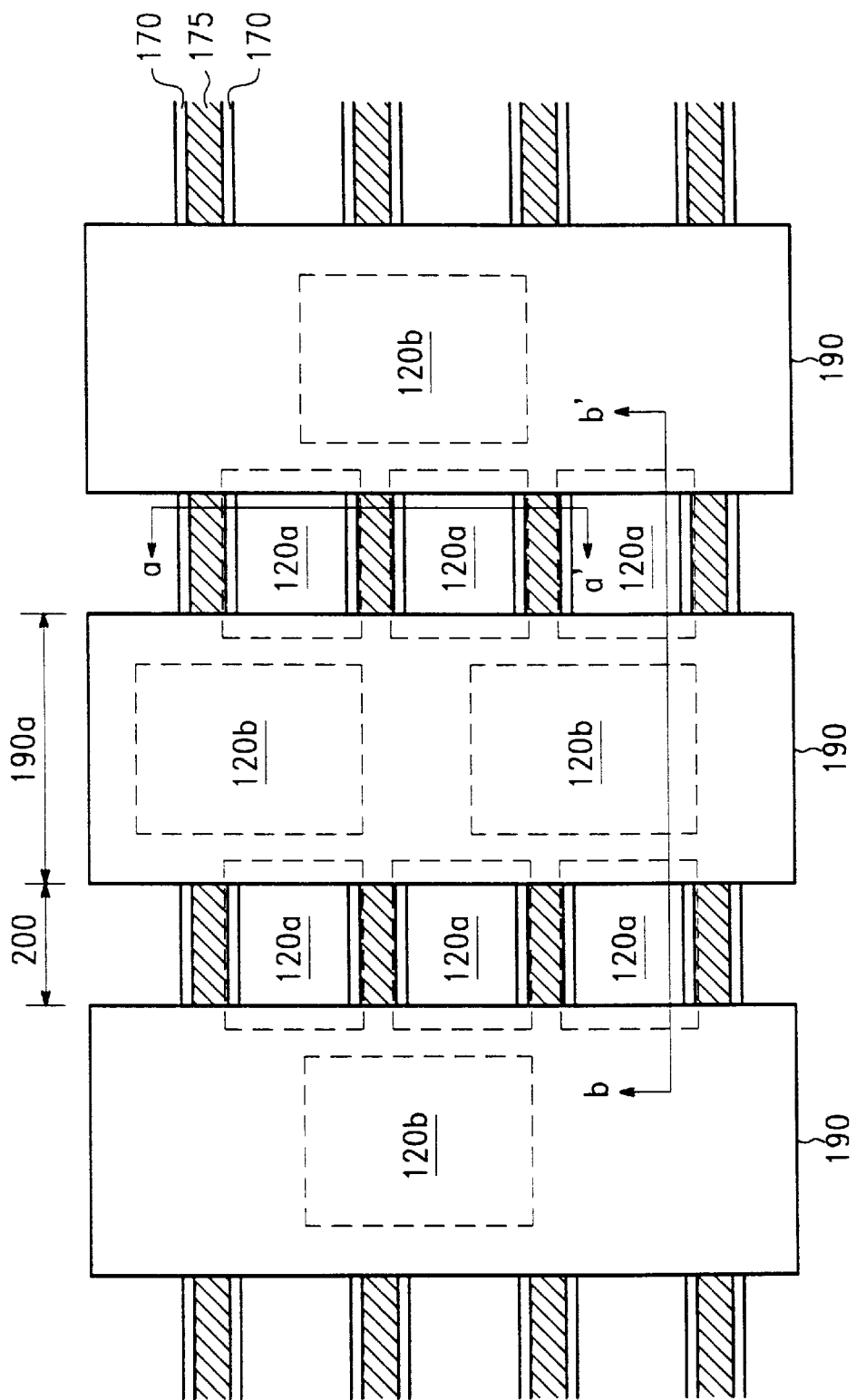
FIG. 6 is a top view of forming line masks formed atop the landing pad so as to define the position of the storage node contact.

Referring to FIG. 6, line masks 190 composed of photoresist are formed on the IPD2 180. The line masks 190 are perpendicular to the bit lines 175. Each have a spacing 200 (or called line opening 200) smaller than the lading pad width 120a by about 0.05–0.1 μm. The purposes are to accommodate the misalignment and prevent the short circuit of the landing pads since each line opening position over only one landing pad. For example, for a 0.25 μm feature size of DRAM, the intervals of line opening 200 and the width of line mask 190a are between about 0.35–0.5 μm and 0.55–0.8 μm, respectively. Therefore, the formation of such photoresist pattern is not critical.

Figure 7A:
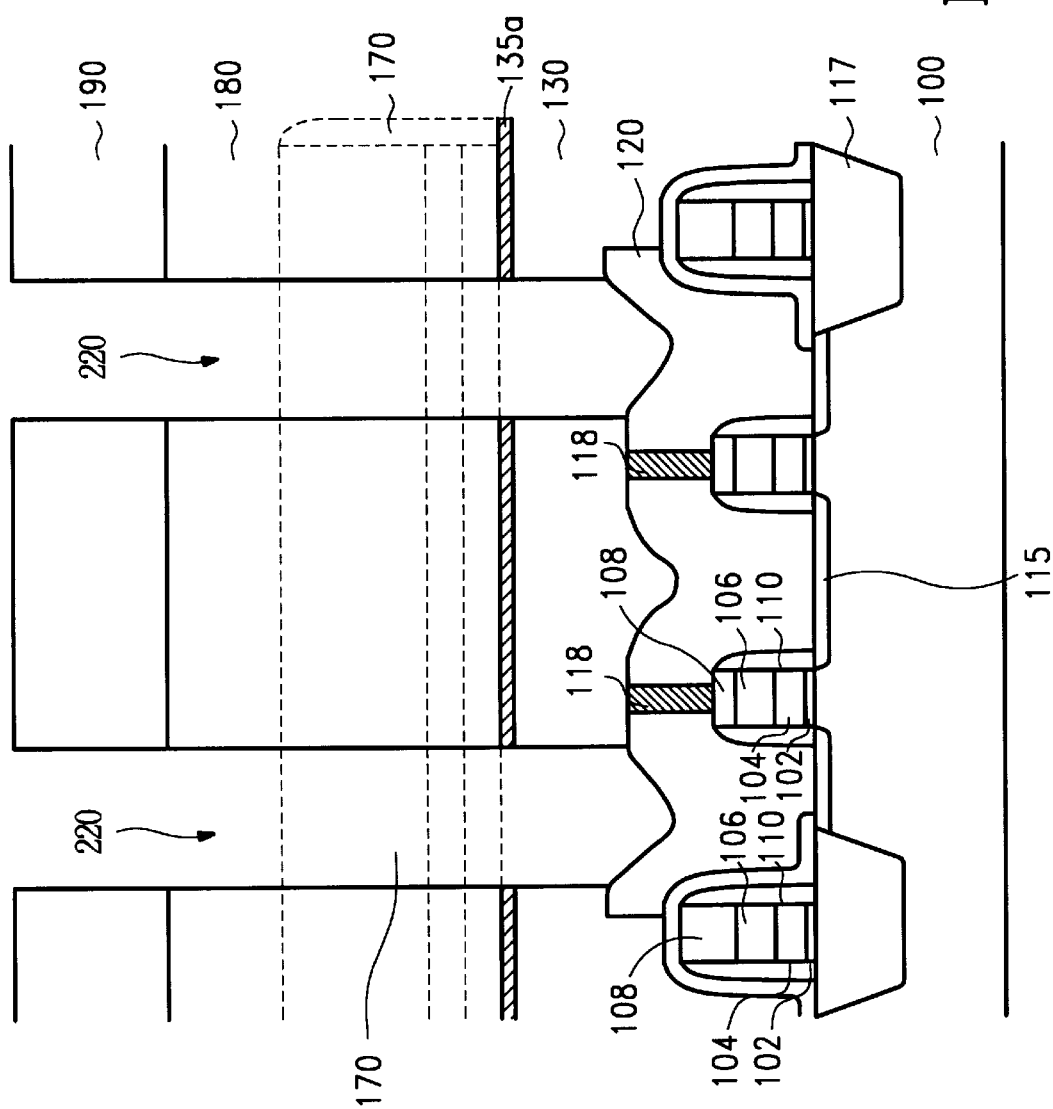
FIGS. 7A–7B are cross-sectional views along a b–b' line in FIG. 6, which shows an etching through IPD2 and IPD1 to form recessed region being achieved in accordance with the first and the second embodiment of the present invention, respectively.
Figure 7B:
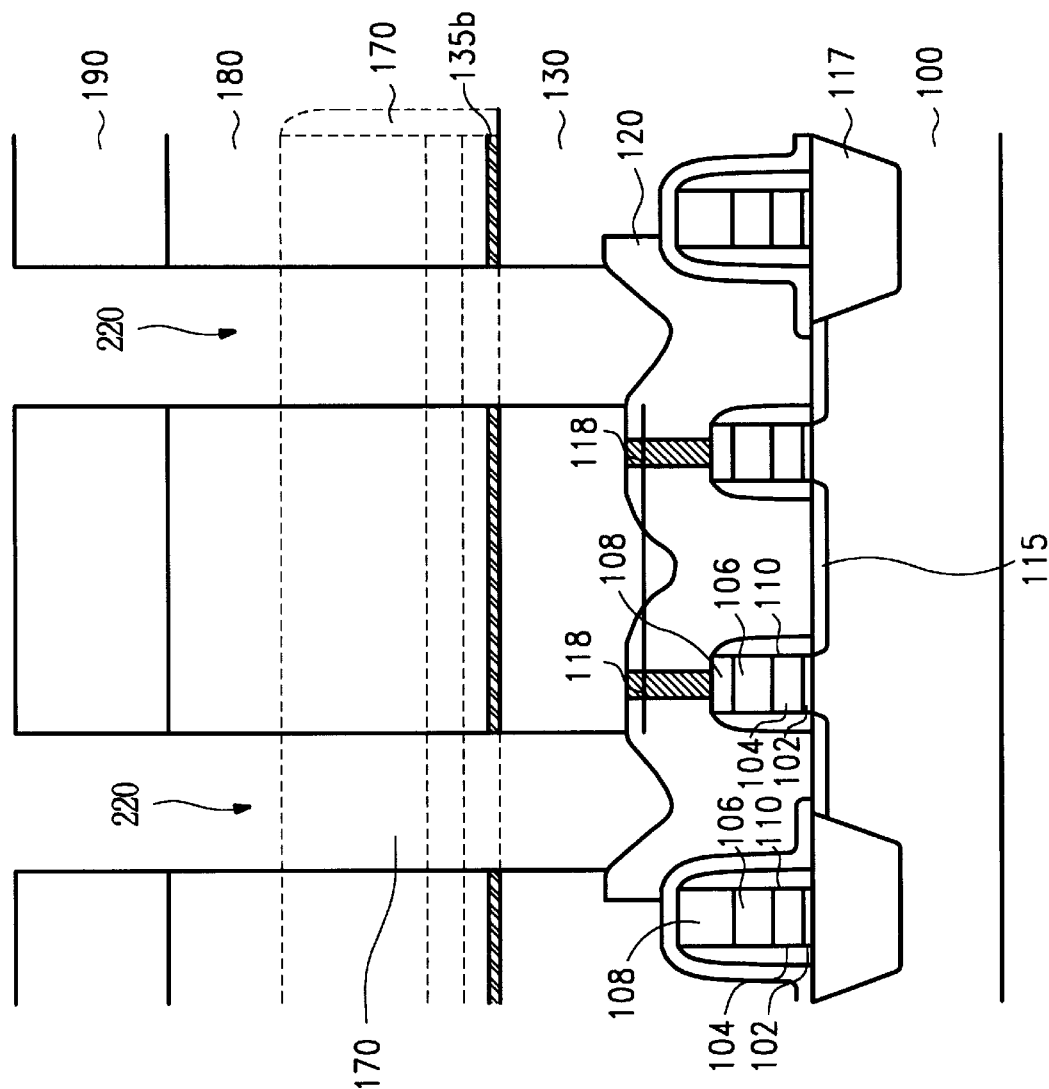

After that, please see the FIGS. 7A and 7B, the cross-sectional views according to the first embodiment and second embodiment, which are along a line b–b' in FIG. 6. A self-aligned contact (SAC) process is done to form a plurality of recess regions 220. The processes are achieved by performing three-stage dry etch to etch IPD2 180, through thin nitride barrier layer 135a or thin nitride liner 135b, and IPD1 130, using the landing pads or landing plugs 120 as stopping layers. During the etching processes, the bit-line nitride spacers 170 and nitride capping layers 160 serve as hard masks. The processes are as follows: at first dry etch stage, a first gas mixture flow is induced into a plasma etch chamber to perform an anisotropic etching to etch unmask portions of IPD2 180, and stopped at the nitride barrier 135a or the nitride liner 135b. The second dry etch stage is followed using a second gas mixture to break-through the nitride barrier 135a. And then the third dry etch stage is successively, to etch the IPD1 and stop on the landing pad 120 using a third gas mixture as plasma chemistries. In a preferred embodiment, the first gas mixture is $C_4F_8$, $CH_2F_2$ and Ar. The second etching gas mixture is $CH_3F$ and $O_2$, and the third gas mixture is $C_4F_8$, $CH_2F_2$ and Ar.

Figure 8:
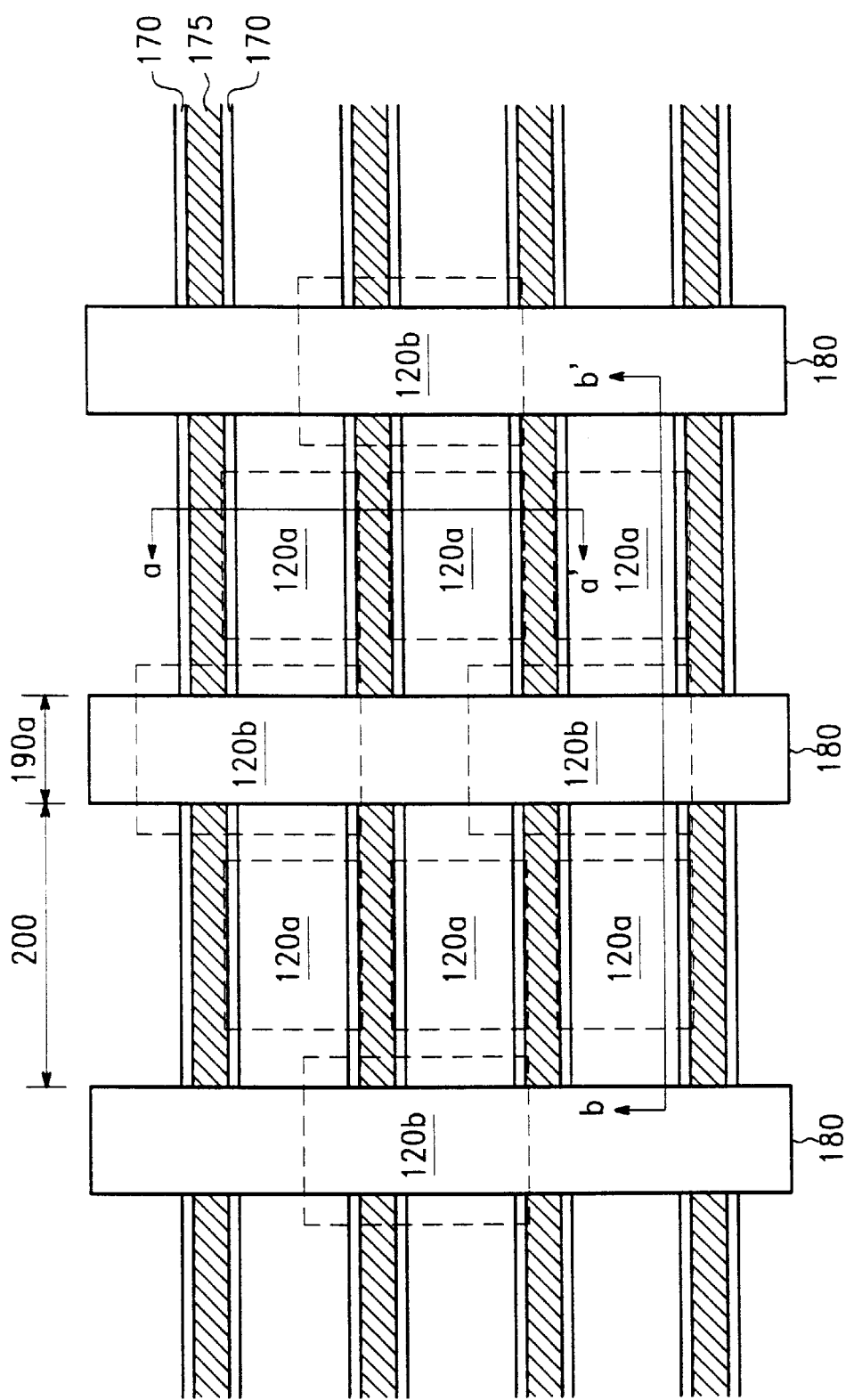
FIG. 8 is a top view of the line masks, which are descummed so as to expand the storage node.

Please refer to FIG. 8, a top view, the photoresist descum using $O_2$ based gas (e.g. Ar and $O_2$) to shrink the photoresist is done. The line masks 190 is preferably shrunk for 0.2–0.3 μm per side so that each line mask only has 0.15–0.3 μm in width being remnant.

Figure 9A:
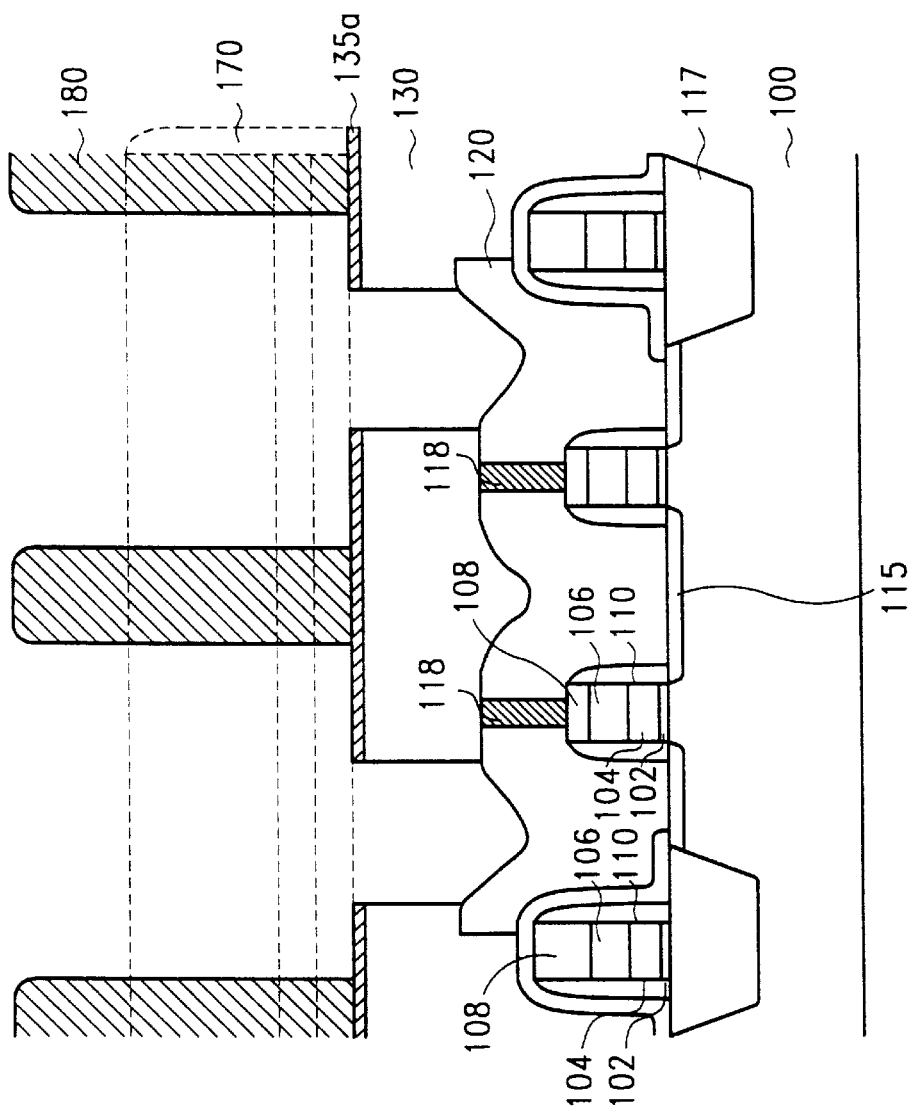
FIGS. 9A–9B are cross-sectional views along a b–b' line in FIG. 8, which shows IPD2 etching stopped on the nitride barrier is achieved in accordance with the first and the second embodiment of the present invention, respectively.
Figure 9B:
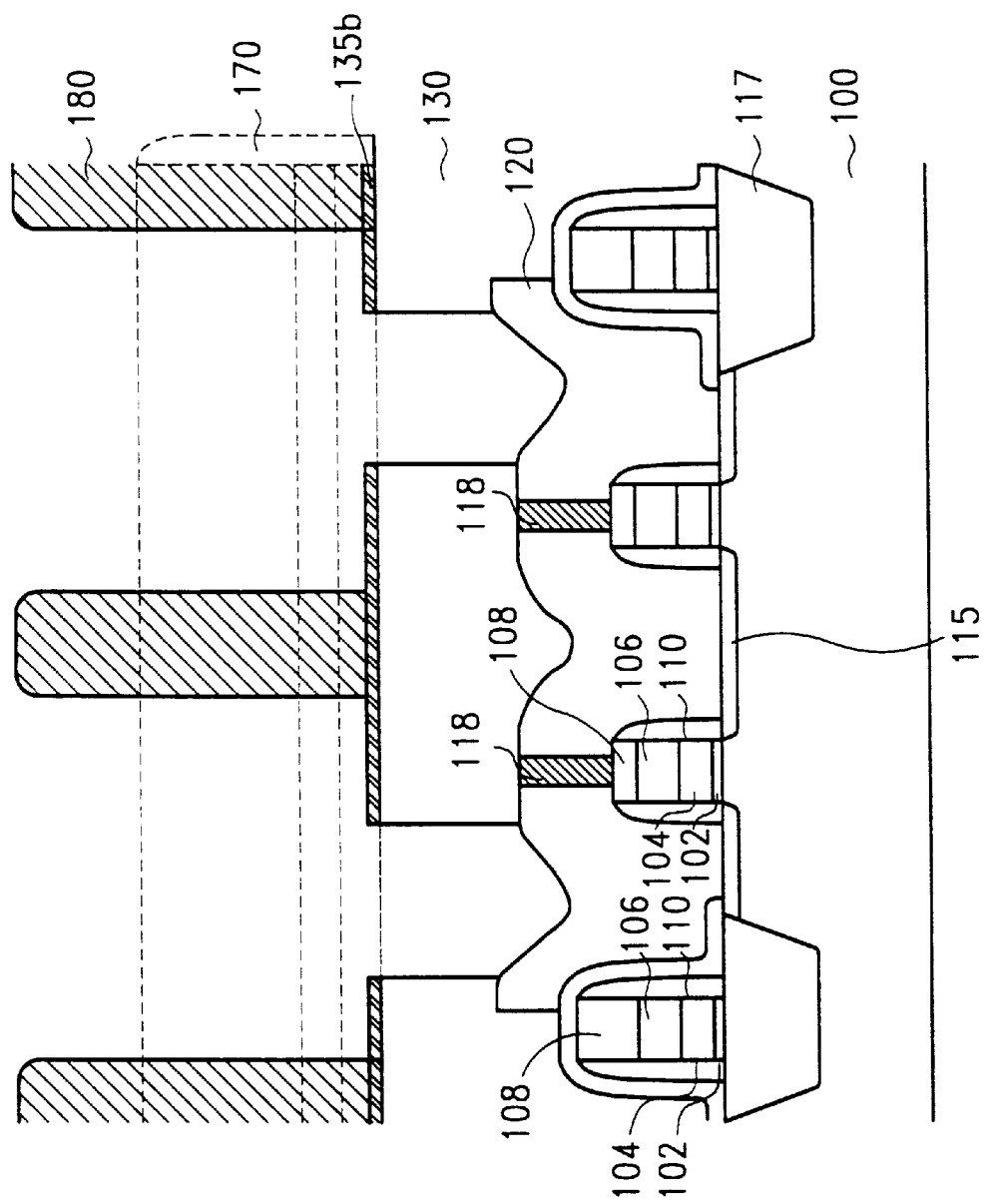

After that, please see FIGS. 9A–9B, an anisotropic etching using the resulting line masks 190 as masks to etch the exposed portions of IPD2 so as to expand the storage node size by 0.2–0.3 μm per side. The reason to expand storage node size is due to the length of the storage node long side being larger than the landing pad size.

Since the storage node is directly formed on a landing pad 120a, the storage node contact mask is thus reduced.

Figure 10A:
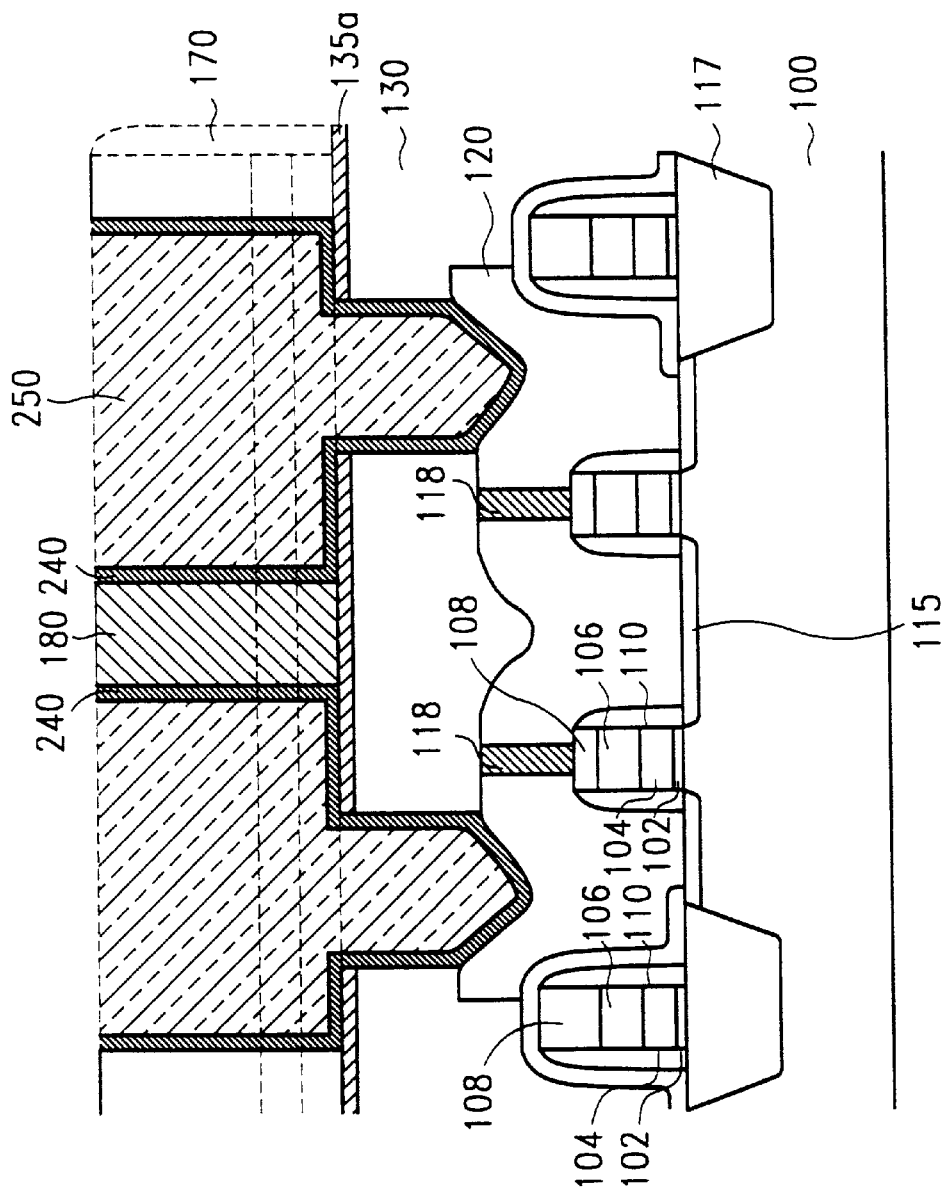
FIGS. 10A–10B are cross-sectional views along a b–b' line in FIG. 8, which shows first in-situ doped (ISD) polysilicon, and photoresist are sequentially formed and is then etched back using nitride capping layer as a stopper in accordance with the first and the second embodiment of the present invention, respectively.
Figure 10B:
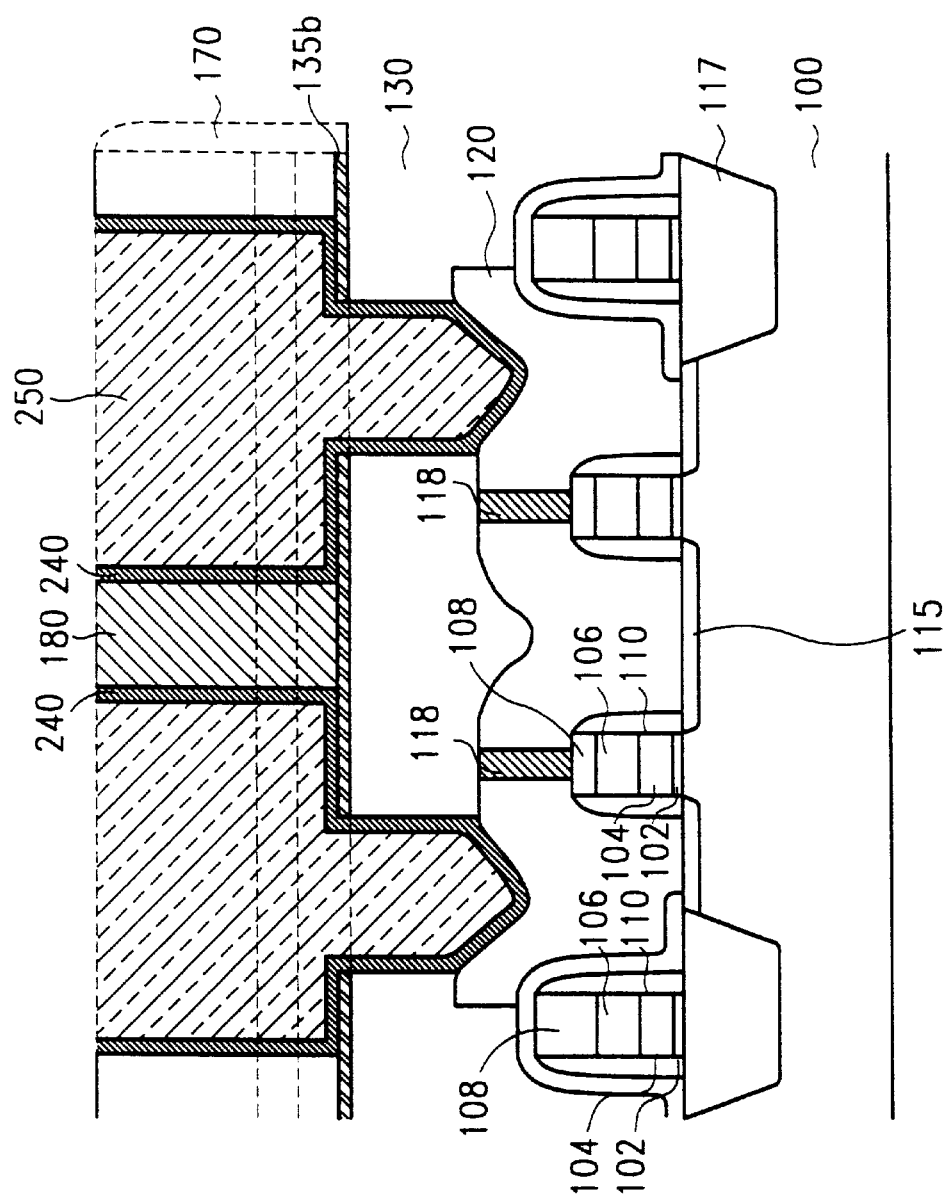

After that, please see the FIGS. 10A and 10B, the cross-sectional views according to the first embodiment and second embodiment, which are along a line b–b' in FIG. 8. After stripping the line masks 190, a conductive layer 240 served as a bottom electrode of the storage nodes is formed on the resulting structure. Preferably, the conducing layer is a first in-situ doped (ISD) polysilicon layer of about 40–70 nm. A photoresist layer 250 refilled the recession regions is then achieved. A CMP process is then followed to remove a portion of the photoresist layer and the conducting layer using the nitride capping layer 160 as an etching stopping layer so that the same topographic height as the nitride capping layer 160 is obtained.

Figure 11A:
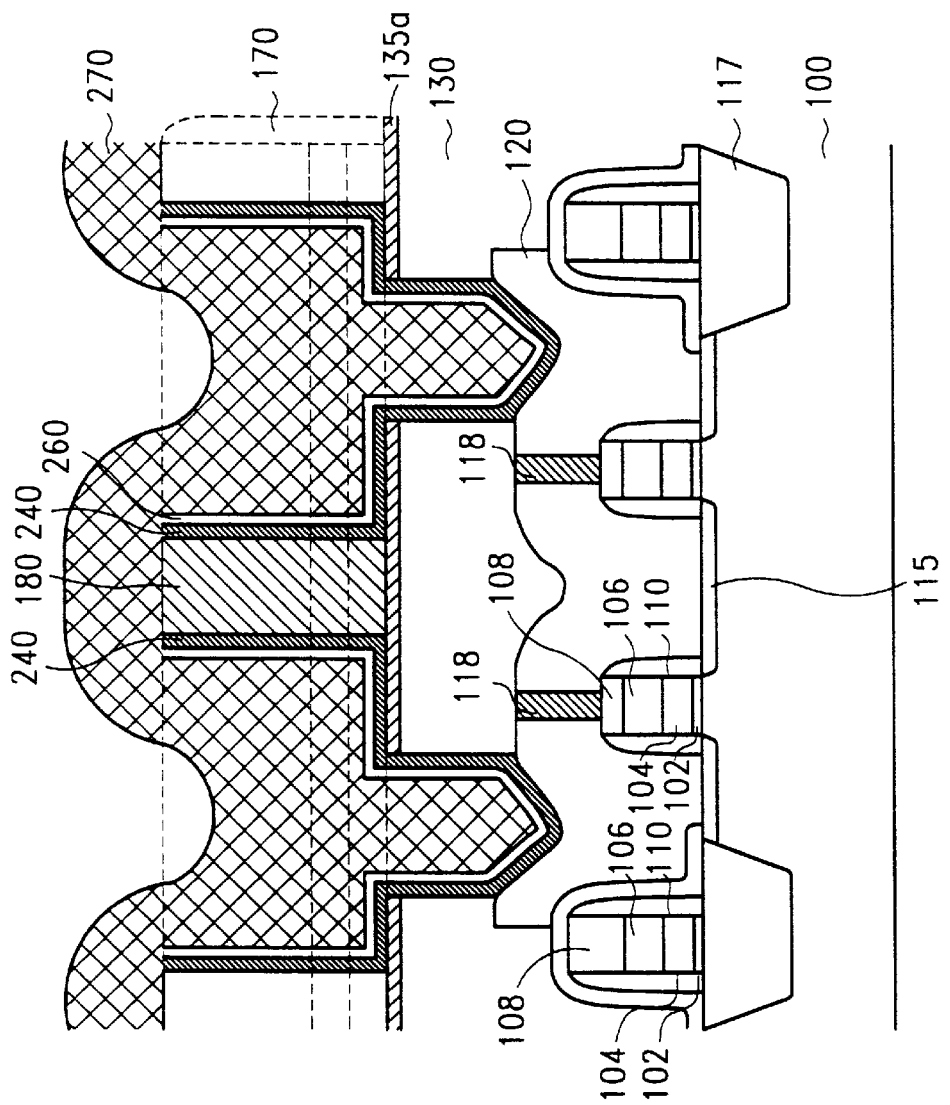
FIGS. 11A–11B are cross-sectional views along a b–b' line in FIG. 8, which shows the removal of the photoresist being done and then performs a dielectric layer and a second in-situ doped polysilicon in accordance with the first and the second embodiment of the present invention, respectively.
Figure 11B:
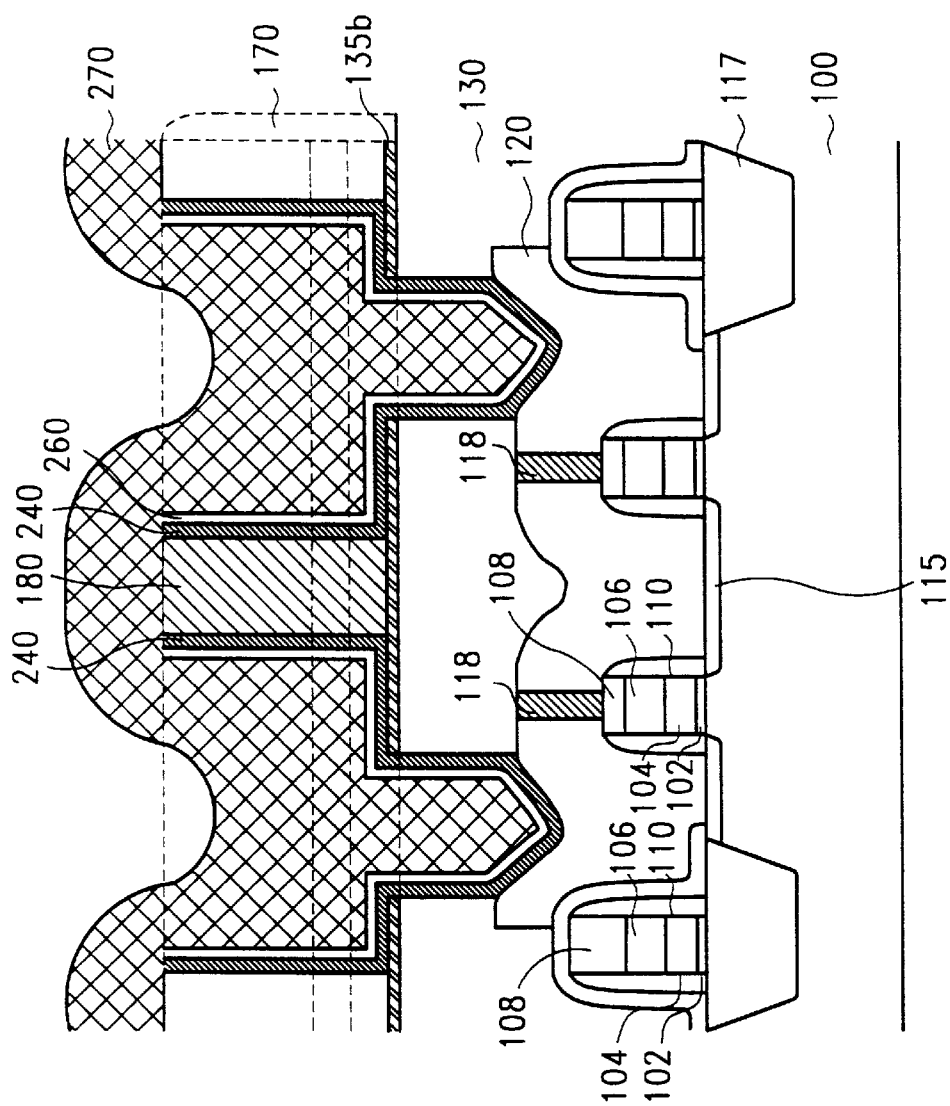

The photoresist layer 250 acts as a protecting layer and is then stripped away by a conventional method. Referring to FIGS. 11a and 11b according to the first embodiment and second embodiment, respectively. For forming DRAM capacitors completely, a thin dielectric conformal layer 260 is formed of about 5–10 nm on the first ISD polysilicon layer 240, and then a second electrically conductive material, such as another ISD polysilicon layer 270 is then sequentially deposited. In a preferred embodiment, the thin dielectric layer 260 is prepared by CVD, including $Ta_2O_5$, $LiNbO_3$ and PLZT (lead lanthanum zirconate titanate), or fabricated by LPCVD, including a stack ONO (oxide/nitride/oxide) structure.

The invention provides a method to fabricate DRAM capacitor and has following benefits:

(1) The process uses the bit line nitride cap, nitride spacer and landing pad as etching stopped layers, so the storage node can be directly formed on the landing pad, a mask count for fabricating storage node contact is thus reduced.

(2) The space of IPD 1 and IPD2 layer as well as the lading pad is being fully utilizes for forming storage nodes, and thus reduces the topographic height.

(3) The storage node mask becomes a non-critical process.

While the preferred embodiment of the invention has been illustrated and described, it will be appreciated that various changes can be made therein without departing from the spirit and scope of the invention.

What is claimed is:

1. A method for fabricating capacitors in a DRAM cell, said method comprising the steps of:

providing a semiconductor substrate, which is formed therein with isolation regions, source/drain regions, and word lines which are with first nitride spacers and first nitride capping layers formed atop said word lines;

forming landing pads on said source/drain regions, said first spacers, said first capping layer of said word lines, each one of said landing pads being separated by an isolating layer, said isolating layer is on a portion of said first capping layers;

forming a first dielectric layer on said landing pads and said isolating layers;

forming a nitride barrier layer on said first dielectric layer;

forming bit lines on said nitride barrier layer, each said bit line being formed of a conductive layer, and having a second nitride capping layer on said conductive layer and second nitride spacers on sidewalls of said bit line;

forming a second dielectric layer on all areas of said semiconductor to fill the resulting topography;

forming line photoresist masks on said second dielectric layer, said line photoresist masks being substantially perpendicular to said bit lines, and having line openings each being smaller than each said landing pad, so that said line opening each is above and within only one landing pad;

forming recessed regions by anisotropic etching away unmasked portions of said second dielectric layer through said nitride barrier and said first dielectric layer to stop on said landing pads using said line photoresist masks as a mask, and said second nitride capping layer and said second nitride spacers as a hard mask so as to form recessing regions;

performing a photoresist descum to shrink said line photoresist masks;

anisotropic etching away unmask portions of said second dielectric layer so as to expand said recessed portions using line photoresist masks, said second nitride capping layer, said second nitride spacers as etching masks, and using said nitride barrier layer as an etching stopper;

removing said line photoresist masks;

conformal forming a polysilicon layer on all resulting surface of substrate;

forming a photoresist layer on polysilicon layer to refill resulting topography; and performing a planarization process using said second nitride capping layer as a stopping layer.

2. The method of claim 1, after performing a planarization process, further comprising
removing said photoresist layer;
forming a capacitor dielectric layer on said polysilicon layer; and
forming a capacitor top plate of said DRAM cell on said capacitor dielectric layer.

3. The method of claim 1, wherein said first dielectric layer is formed of a material of about 200–400 nm in thickness, and selected from the group consisting of a LPTEOS, a BPSG, a HDP CVD oxide, a PETEOS and an ozone TEOS layer.

4. The method of claim 1, wherein said second dielectric layer is formed of a material of about 400–600 nm in thickness, and selected from the group consisting of a BPSG, a HDP CVD oxide and an ozone TEOS layer.

5. The method of claim 1, wherein said step of forming recessed regions comprising the steps of:
using a first gas mixture as etching chemistries to etch unmask portions of said second dielectric layer using said nitride barrier layer as an etching stopper;
performing an nitride breakthrough etching to etch exposed portions of said nitride barrier by using a second gas mixture as etching chemistries; and
performing an anisotropic etching to etch exposed portions of said first dielectric layer by using a third gas mixture as etching chemistries, and using said landing pads as etching stopping layers.

6. The method of claim 5, wherein said first gas mixture comprises $C_4F_8$, $CH_2F_2$ and Ar.

7. The method of claim 5, wherein said second first gas mixture comprises $CH_3F$ and $O_2$.

8. The method of claim 5, wherein said third gas mixture comprises $C_4F_8$, $CH_2F_2$ and Ar.

9. The method of claim 1, wherein said line photoresist masks each and said line opening each are between about 0.5–0.8 µm and 0.35–0.5 µm in width, respectively.

10. The method of claim 1, wherein said step of polysilicon layer is an in-situ doped polysilicon layer having a thickness between about 40–70 nm.

11. The method of claim 1, wherein said nitride barrier is between about 15–50 nm in thickness.

12. A method for fabricating capacitors in a DRAM cell, said method comprising the steps of:
providing a semiconductor substrate, which is formed therewith with isolation regions, source/drain regions, and word lines which are with first nitride spacers and first nitride capping layers on tops of said word lines;

forming landing pads on said source/drain regions, said first spacers, said first capping layer of said word lines, each one of said landing pads being separated by an isolating layer, said isolating layer is on a portion of said first capping layers;

forming a first dielectric layer on said landing pads and said isolating layers;

forming bit lines on said first dielectric layer, each said bit line being formed of a conductive layer, and having a second nitride capping layer on said conductive layer and second nitride spacers on sidewalls of said bit line;

forming a nitride liner layer on said bit lines and elsewhere of said first dielectric layer;

forming a second dielectric layer on all areas of said semiconductor to fill the resulting topography;

forming line photoresist masks on said second dielectric layer, said line photoresist masks being perpendicular to said bit lines, and having line openings each being smaller than each said landing pad, so that said line opening each is above and within only one landing pad;

anisotropic etching away unmask portions of said second dielectric layer by using a first gas mixture as etching chemistries and, using said line photoresist masks, said second nitride capping layer and said second nitride spacers as etching masks and using said nitride liner layer as an etching stopper;

performing an nitride breakthrough etching to etch exposed portions of said nitride liner layer by using a second gas mixture as etching chemistries;

performing an anisotropic etching to etch exposed portions of said first dielectric layer using said landing pads as etching stoppers by using a third gas mixture as etching chemistries;

performing a photoresist descum to shrink said line photoresist masks;

anisotropic etching away unmask portions of said second dielectric layer using line photoresist masks, said second nitride capping layer, said second nitride spacers as etching masks, and using said nitride barrier layer as an etching stopper;

conformal forming a polysilicon layer on all resulting surface of substrate;

forming a photoresist layer on polysilicon layer to refill resulting topography; and performing a planarization process using said second nitride capping layer as a stopping layer;

removing said photoresist layer;

forming a capacitor dielectric layer on said polysilicon layer; and forming a capacitor top plate of said DRAM cell on said capacitor dielectric layer.

13. The method of claim 12 wherein said first dielectric layer is formed of a material of about 200–400 nm in thickness, and selected from the group consisting of a LPTEOS, a BPSG a HDP CVD oxide, a PETEOS and an ozone TEOS layer.

14. The method of claim 12, wherein said second dielectric layer is formed of a material of about 400–600 nm in thickness, and selected from the group consisting of a BPSG, a HDP CVD oxide and an ozone TEOS layer.

15. The method of claim 12, wherein said first gas mixture comprises $C_4F_8$, $CH_2F_2$ and Ar.

16. The method of claim 12, wherein said second first gas mixture comprises $CH_3F$ and $O_2$.

17. The method of claim 12, wherein said third gas mixture comprises $C_4F_8$, $CH_2F_2$ and Ar.

18. The method of claim 12, wherein said line photoresist masks each and said line opening each are between about 0.5–0.8 μm and 0.35–0.5 μm in width, respectively.

19. The method of claim 12, wherein said step of polysilicon layer is an in-situ doped polysilicon layer having a thickness between about 40–70 nm.

20. The method of claim 12, wherein said nitride barrier is between about 15–50 nm in thickness.

* * * * *